United States Patent [19]

Coxon

[11] Patent Number: 5,506,414
[45] Date of Patent: Apr. 9, 1996

[54] CHARGED-PARTICLE ANALYZER

[75] Inventor: Peter Coxon, Buxted, England

[73] Assignee: Fisons PLC, Ipswich, England

[21] Appl. No.: 218,132

[22] Filed: Mar. 25, 1994

[30] Foreign Application Priority Data

Mar. 26, 1993 [GB] United Kingdom .................... 9306375
Oct. 12, 1993 [GB] United Kingdom .................... 9320954

[51] Int. Cl.$^6$ .................................................. H01J 47/00
[52] U.S. Cl. .......................................... 250/305; 250/310
[58] Field of Search ................................... 250/305, 310, 250/397

[56] References Cited

U.S. PATENT DOCUMENTS

| | | |
|---|---|---|
| 3,766,381 | 10/1973 | Watson . |
| 3,822,382 | 7/1974 | Koike ........................ 250/305 |
| 3,937,957 | 2/1976 | Schillalies et al. ............ 250/305 |
| 4,540,885 | 9/1985 | Plies et al. .................. 250/310 |
| 4,737,639 | 4/1988 | Rusch ........................ 250/305 |
| 4,758,723 | 7/1988 | Wardell et al. .............. 250/305 |
| 4,810,879 | 3/1989 | Walker ...................... 250/305 |
| 4,810,880 | 3/1989 | Gerlach ..................... 250/305 |
| 4,882,487 | 11/1989 | Gerlach ..................... 250/305 |

FOREIGN PATENT DOCUMENTS

| | | |
|---|---|---|
| 0243060 | 4/1987 | European Pat. Off. . |
| 0246841 | 11/1987 | European Pat. Off. . |
| 0293924 | 6/1988 | European Pat. Off. . |
| 1332207 | 5/1971 | United Kingdom . |
| 1367302 | 8/1971 | United Kingdom . |

OTHER PUBLICATIONS

Prutton, M. Surface Physics, Oxford University Press, 1983.
Woodruff, D. P., Delchar, A., Cambridge University Press, 1986.
Drummond et al, Journal of Vacuum Science and Technology, 1991.

Primary Examiner—Bruce C. Anderson
Attorney, Agent, or Firm—Chilton, Alix & Van Kirk

[57] ABSTRACT

The invention provides apparatus and methods for investigating a small selected area of the surface of a specimen. The specimen is irradiated by a primary beam of X-rays or electrons to cause it to emit electrons. These are collected by a novel electron-optical arrangement and are used to create an image of the selected area of the surface using only those electrons emitted with energies lying in a specified range. Apparatus according to the invention has greater sensitivity and spatial resolution than previously known apparatus.

18 Claims, 5 Drawing Sheets

CHARGED-PARTICLE ANALYZER

This invention relates to charged-particle analyzers and in particular to energy spectrometers, microscopes and spectromicroscopes. Primarily, the invention provides means for investigating the surface properties of a specimen.

The use of charged-particle analyzers for surface analysis is a well-established practice and an introduction to this subject may be found in many texts, such as for example, 'Surface physics' by M. Prutton (Oxford University Press) and 'Modern techniques of surface science' by D. P. Woodruff and T. A. Delchar (Cambridge University Press). The charged particles emitted from the specimen surface may take the form of positive ions, negative ions or most commonly electrons.

An energy spectrum of the sample may be obtained by means of a suitable energy analyzer, typically of the electrostatic toroidal capacitor type. Alternatively, an image of the specimen may be formed by detecting the change in intensity of the emitted particles across the surface. Such techniques are commonly referred to as spectroscopy and microscopy respectively and provide complementary information relating to the specimen surface.

Photoelectron spectroscopy is often used to study the surface of a specimen. In this technique, the specimen is irradiated by means of an X-ray or ultraviolet source that causes electrons in the energy range from zero to several thousand electron Volts (eV) to be emitted from the surface. It is usual because of differences in the photon source to refer to X-ray photoelectron spectroscopy (XPS) and ultraviolet photoelectron spectroscopy (UPS). The emitted electrons may be focused by an electron lens and separated in energy by an analyzing device. Electrons of a particular energy may then be selected by an apertured plate and detected by means such as channel multiplier and electronically recorded.

The success of XPS in determining the electronic structure of surfaces has led to the requirement for an imaging capability from electron spectrometers. This may be achieved in two ways, firstly by restricting the area of the sample irradiated by the X-ray source and secondly by detecting electrons emitted from only a part of the specimen surface. The difficulty of obtaining a finely focused X-ray beam has concentrated development in the second of these categories.

Developments in selected area XPS have led to a number of devices capable of use as both a photoelectron spectrometer and a photoelectron microscope. With suitable magnetic or electrostatic fields it is possible to generate a charged particle image of the specimen surface comprised of charged particles having energies within a certain energy range. The resultant image is passed into an energy analyzer to produce an energy resolved image of the surface which may be measured and electronically processed as required. Since charged particles may be emitted over a range of different energies, the imaging fields and energy analyzer may be adjusted to create a spectrum of such energies. From the charged-particle image and spectrum it is possible to gain information regarding the physical and chemical nature of the surface region of the specimen.

The device described in GB patent 1332207 and U.S. Pat. No. 3,766,381 provides means for selecting an area of the specimen surface by placing an apertured plate at the image plane of the electron lens so that only electrons from a part of the specimen surface will be admitted to the energy analyzer. An objective aperture is also used to limit the collection angle of charged particles focused by the lens. The resolution of the selected area that may be obtained in this instance is limited by a number of factors that include aperture size and lens properties such as electron optical aberrations.

In European application no. 243060 there is described a device for studying a selected area of a specimen that uses a combination of magnetic and electrostatic lens elements together with apertured plates. The provision of both magnetic and electrostatic lens elements offers advantages over a device employing a single type of focusing field. A well-known feature of a magnetic lens is that it has an imaging capacity greater than that of an electrostatic lens due to its lower spherical and chromatic aberrations, while downstream electrostatic lens elements permit further manipulation of the charged particle beam before it enters the energy analyzer.

We have now recognised that a number of problems arise from the use of the arrangement described in EP 243060. For example, in such an arrangement the objective aperture would typically be located in the diffraction plane of the objective lens formed by the focusing field. (The objective aperture and diffraction plane are also known in the art as the collection aperture and crossover plane, respectively). As the magnification of the magnetic objective lens is changed to produce images of differently dimensioned selected areas, the diffraction plane moves and consequently there is no single position for this aperture appropriate to all applications.

Furthermore, at the high magnifications required to achieve the desired spatial resolution, the diffraction plane becomes increasingly close to the specimen surface so that it becomes impractical to correctly place the collection aperture mechanism. The necessary proximity of the collection aperture to the surface also tends to prevent the placing of further equipment around the specimen. This is a considerable disadvantage in surface analysis since it is common practice to employ several investigative techniques in the same instrument.

It is an object of the present invention to provide a charged-particle analyzer which is capable of imaging a specimen surface over a wide range of magnifications by means of a lens having both electrostatic and magnetic components. It is a further object of the invention to provide a charged particle analyzer in which the area surrounding the specimen is substantially free from charged-particle optical devices. It is a still further object of the invention to provide a charged-particle analyzer having a greater field of view for a given lens diameter than prior types of analyzers.

According to the invention there is provided apparatus for investigating a selected area of the surface region of a specimen comprising:

(a) a specimen holder;

(b) at least one source of radiation for causing the emission of charged particles from a specimen placed on said specimen holder;

(c) an objective lens for imaging in an image plane at least some of said charged particles emitted from said specimen;

(d) a first diaphragm located proximate said image plane, said first diaphragm having an aperture therein which defines a selected area of the specimen which is to be investigated;

(e) a second lens located downstream of said first diaphragm, for refocusing the charged particles;

(f) anaylzing means for analyzing the energy of the charged particles emitted from the specimen and disposed to receive at least some of the charged particles from said second lens; and (g) a second diaphragm located between said second lens and said analyzing means, said second diaphragm having an aperture therein to define the collection angle of the charged-particles from the specimen.

This arrangement allows the apparatus to accommodate widely varying changes in magnification such as that which may occur if a magnetic objective lens is substituted for an electrostatic lens.

The apparatus is capable of operating with an electrostatic objective lens, but in a preferred embodiment a magnetic objective lens is used. This typically provides a higher magnification. In a particularly preferred embodiment the objective lens of the device comprises an electrostatic lens component along with a magnetic lens component. These may be used in combination or independently of one another. Therefore, when maximum magnification is required, the magnetic lens is employed, but by use of the electrostatic lens alone the device can function with reduced imaging capability if it is found that the magnetic field adversely affects the specimen or other essential parts of the apparatus, for example, the additional equipment required for Auger electron spectroscopy, scanning electron microscopy, scanning Auger microscopy and electron energy loss spectroscopy.

Preferably, the first and second diaphragms are provided with means for independently adjusting the dimensions of the apertures that they contain.

In one preferred embodiment, the second apertured diaphragm may be placed at the diffraction plane of the second lens to provide optimum definition of the collection angle of charged particles from the specimen. In a more preferred embodiment, however, the second apertured diaphragm is placed between the diffraction plane of the second lens and its image plane, and preferably between the diffraction plane and a point not greater than the focal length of the second lens from the diffraction plane, thereby providing a greater field of view for a given lens diameter than is available when the diaphragm is placed at the diffraction plane.

In another preferred embodiment a third lens may be provided between the second lens and the entrance of the energy analyzer to efficiently transmit the charged particles from the second lens to the energy analyzer. The third lens may be arranged simply to re-focus on the object plane of the energy analyzer the image produced by second lens, but in a most preferred embodiment the features of the imaging electron energy spectrometer disclosed in EP 246841, which allows the production of an image of the specimen surface comprising only electrons in a specified energy range, may be incorporated. This may be done by arranging the third lens to produce at the entrance of the analyzer a quasi-Fourier transform of the image produced by the second lens. Another lens, disposed between the exit of the analyzer and an imaging electron detector, is also provided to back-transform the quasi-Fourier image transmitted by the analyzer to a real image on the detector of the specimen surface comprising only those electrons transmitted by the analyzer.

Viewed from another aspect the invention provides a method of investigating a selected area of the surface of a specimen, said method comprising:

(a) irradiating said specimen to cause the emission of charged particles therefrom;

(b) using an objective lens, focusing at least some of the charged particles emitted from said specimen to form a charged-particle image of said specimen in an image plane;

(c) selecting a portion of said charged-particle image by passing said charged particles through an aperture in a first diaphragm disposed proximate said image plane;

(d) using a second lens, re-focusing the charged particles passing though the aperture in said first diaphragm;

(e) defining the collection angle of said charged particles emitted from said specimen by passing the charged particles leaving said second lens through an aperture in a second diaphragm; and (f) passing at least some of the charged particles passing through the aperture in said second diaphragm into a charged-particle energy analyzer.

In further preferred methods, the second diaphragm may be located between the diffraction plane of the second lens and a point not exceeding the focal length of said second lens from the diffraction plane.

According to the invention, the area of the specimen from which charged particles are emitted and pass into the charged-particle energy analyzer (that is, the area of the specimen that is imaged) may be changed by changing the overall magnification of the objective and second lenses.

As has been noted previously, the charged particles of the invention may be electrons, negative ions or positive ions. To simplify the descriptions that follow, reference has been made only to electrons but the specification should not be construed as being limited to such.

Embodiments of the invention will now be described by way of example only and with reference to the accompanying drawings, in which.

Figure 4:
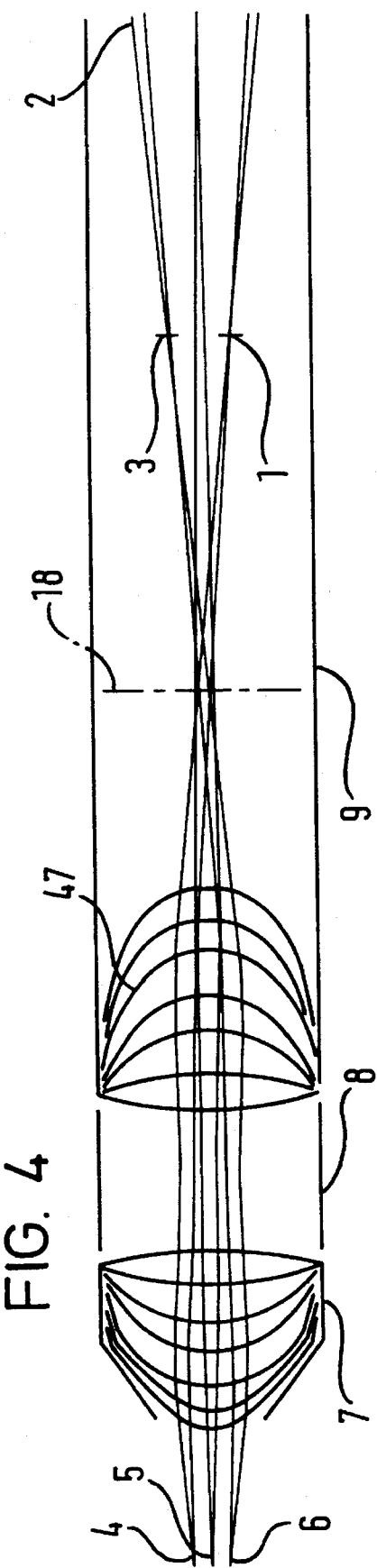
Figure 5:
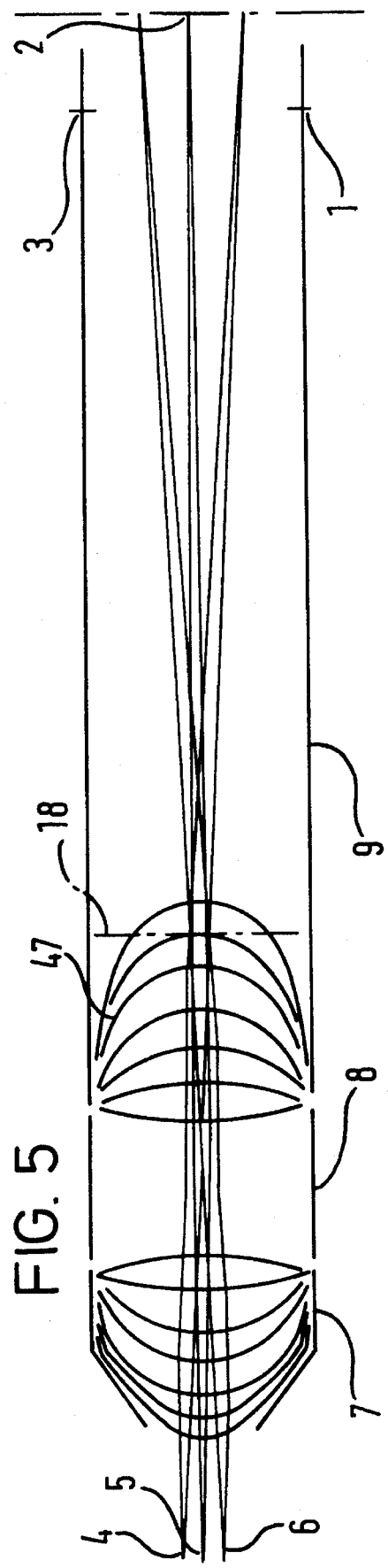
Figure 6:
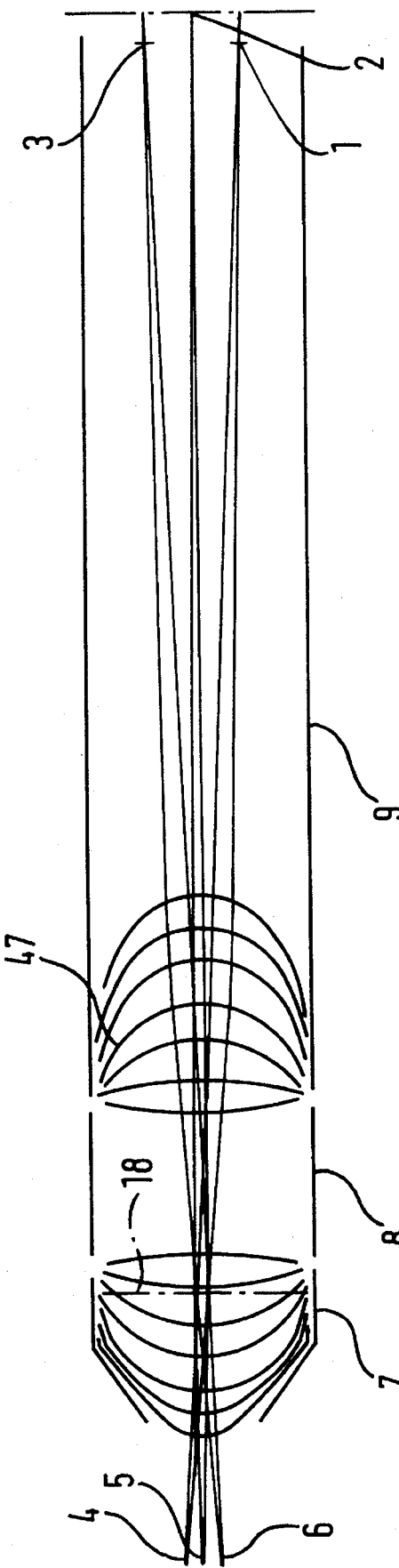

FIGS. 4, 5, and 6 are computer simulated ray diagrams of an electrostatic lens system showing how the present invention provides advantage over the prior art.

Figure 1A:
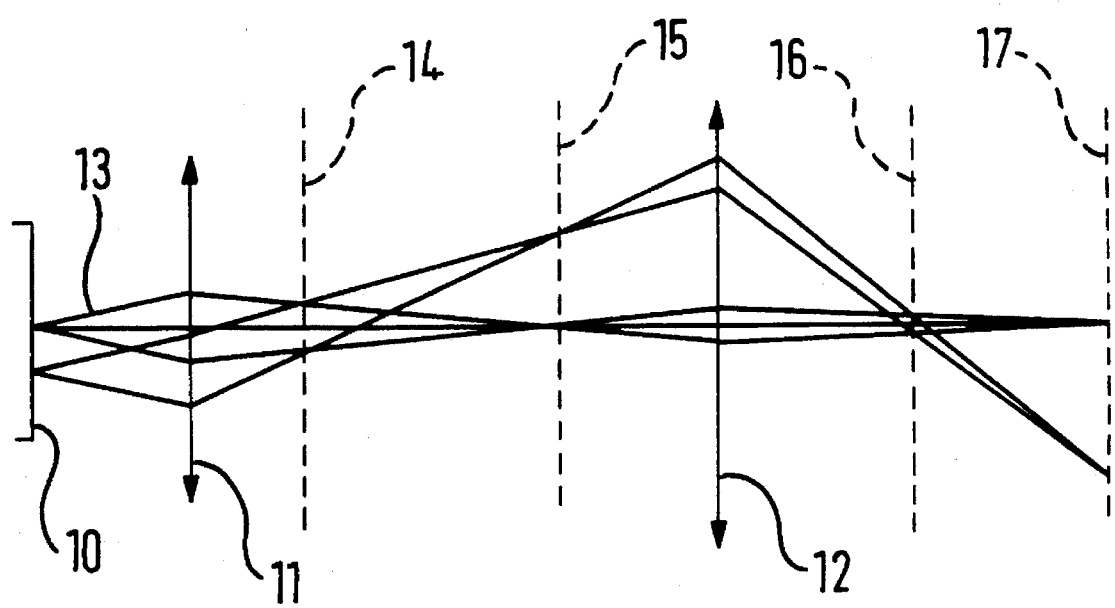
FIGS. 1A and 1B are ray diagrams of the charged particle optics characteristic of prior instruments.
Figure 1B:
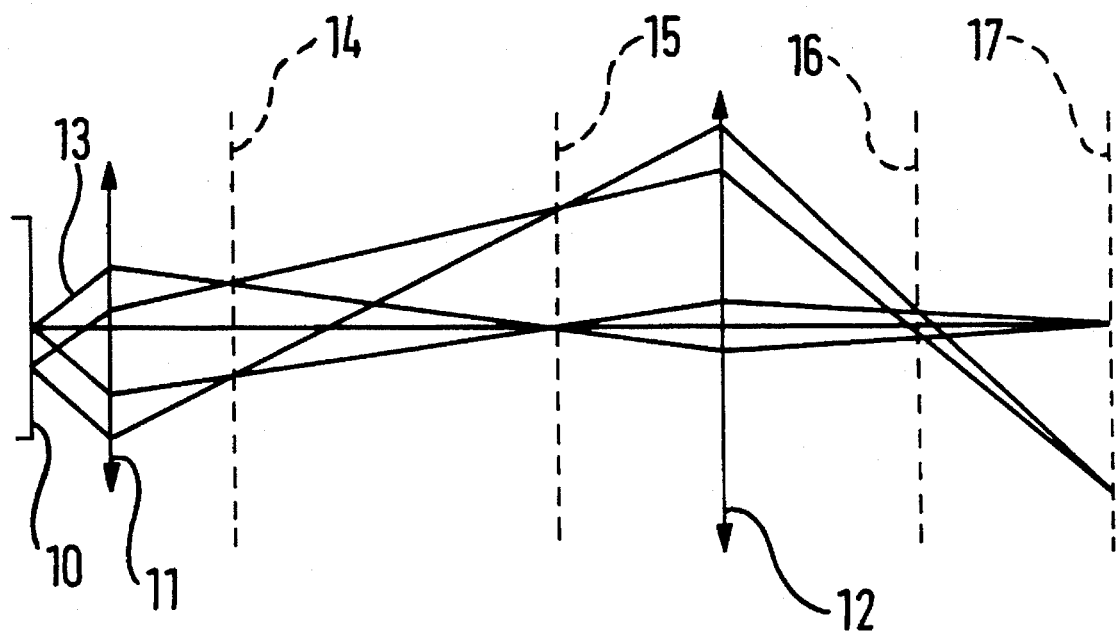

Referring first to FIGS. 1A and 1B, a prior art two lens system for charged particle beams comprises and first and second lenses, indicated respectively at 11 and 12, which define an axis oriented generally perpendicularly with respect to the surface of a specimen 10. Charged particle lenses are generally 'thick' so that the region of varying refractive index extends over a distance which is significant in comparison with the focal length of the lens. However, for most practical purposes there can be found an equivalent 'thin' lens that may be used to illustrate the lens properties in a ray diagram. The solid lines, exemplified by 13, originate from the object plane at the specimen 10 and represent the trajectories of the emitted charged particles. The dashed lines which are parallel to the specimen 10 denote cardinal points of the lens system. The first lens 11 has a diffraction plane 14 and forms an image at the image plane 15. The image plane 15 also acts as the object plane for the second lens 12 which has a diffraction plane 16 and an image plane 17. The prior art devices such as those described in U.S. Pat. No. 3,766,381 and European application no. 243060 achieve the required spatial resolution by the use of two apertured plates, these being an area defining aperture located at the image plane 15 and an aperture to define the collection angle of the objective lens located between the specimen 10 and the image plane 15. As discussed previously, the collection angle defining aperture is typically located at the diffraction plane 14.

The ray diagram of FIG. 1B represents an increase of magnification or change in position of the first lens 11 relative to FIG. 1A, as might be the case when changing from between an electrostatic lens and a magnetic lens. This change results in an image of a smaller area of the specimen 10 being formed. The image plane 15 remains in the same place so that a fixed apertured diaphragm may be used to define the area of interest, but this requires that the effective first lens position and diffraction plane are moved closer to the specimen. The physical presence of the collection aperture in the immediate vicinity of the specimen is a serious drawback because it obstructs the region round the specimen 10 where it is necessary for other equipment to be located. Further, for optimum performance the collection aperture must be physically moved if the magnification of the lens is changed to ensure that it remains located on the diffraction plane of the lens.

Figure 2:
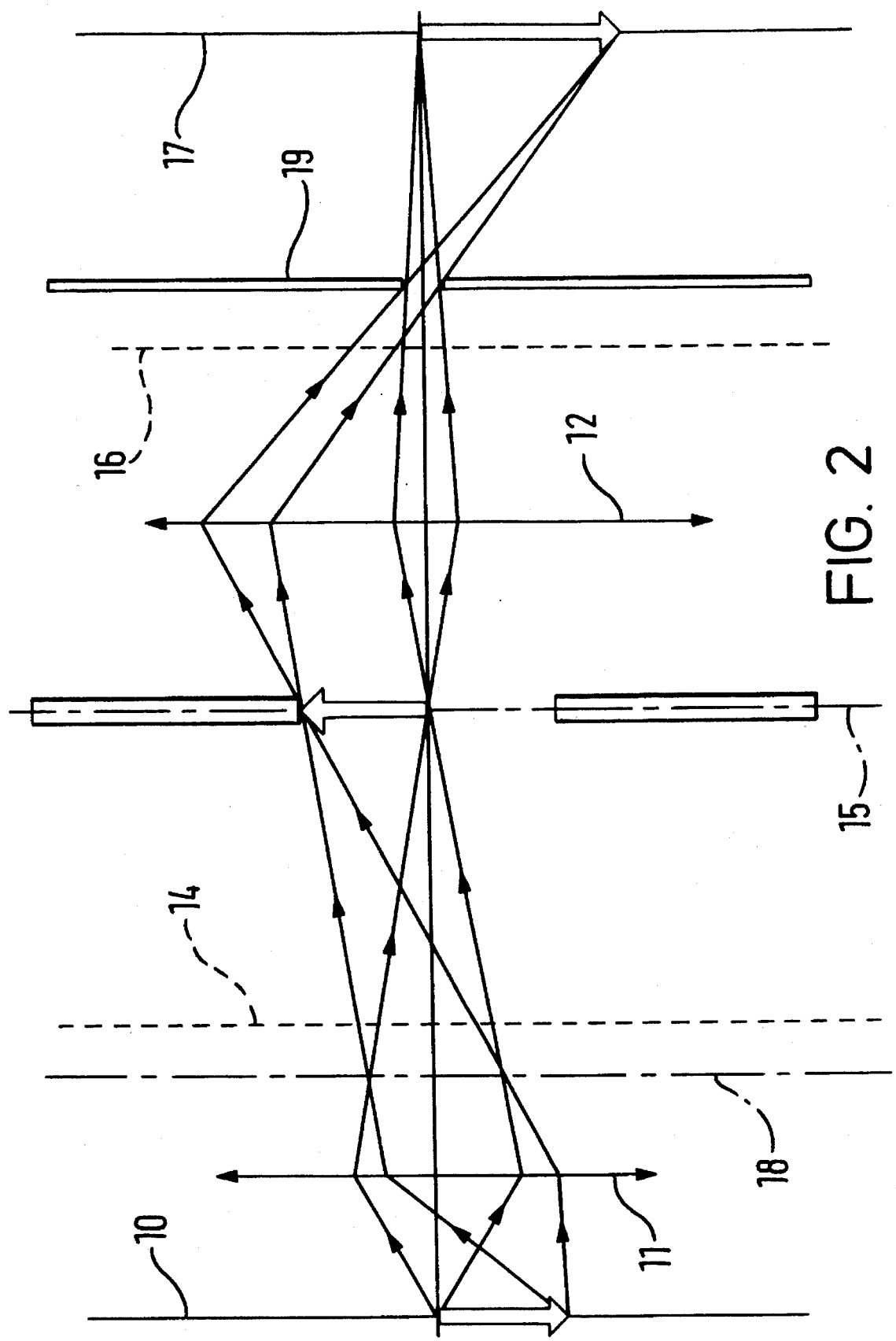
FIG. 2 is a ray diagram of the charged particle optics of an embodiment of the present invention.

In this invention, the problems illustrated by FIGS. 1A and 1B are overcome by a novel arrangement of the apertures necessary for small area surface analysis. The invention provides two electron lenses located in the manner of FIGS. 1A and 1B, but the arrangement of apertured diaphragms, shown in FIG. 2, is different. The collection aperture located after the first lens 11, characteristic of the prior instruments, is dispensed with entirely. A first apertured diaphragm is placed at or near the image plane 15 of the first lens to define the area of the specimen from which electrons pass into the energy analyzer. A second apertured diaphragm 19 is placed following the second lens 12. As shown in FIG. 2, the second lens 12 and the aperture in diaphragm 19 co-operate to determine the collection angle of electrons from the specimen. The position of the plane 18 will change both with the position of the diaphragm 19 and with the magnification of lens 12. Thus, because the magnification of the first lens 11 and the second lens 12 can be adjusted independently, a given overall magnification can be maintained while the magnification of lens 12 can be adjusted to move the plane 18 into any desired position, irrespective of the position of the sample. In this way the limitations imposed by the presence of an objective aperture in prior systems may be overcome.

Another important advantage of the invention is that in comparison with prior systems a greater field of view is available for a given degree of off-axis defocusing. Off-axis distortions in the final image, such as coma and Petzval field curvature, are increased by overfilling the first lens 11, so that in prior systems there is a limit on the field of view imposed by the lens diameter. FIGS. 4, 5, and 6, which are computer simulated ray diagrams corresponding to three different positions of the plane 18, illustrate how the present invention allows a greater field of view to be obtained. In each of FIGS. 4, 5 and 6, an electrostatic lens system comprises three tubular electrodes 7,8 and 9. Points 4, 5 and 6 are three points on the specimen to be imaged, and points 1, 2, and 3 are the images of points 4,5, and 6, respectively, as determined by the computer simulation. The curved lines 47 are equipotential lines in the electrostatic field in the lens.

When the plane 18 is located a long way from the lens, FIG. 4 shows that the plane occupied by the image points 1 and 3 is very considerably displaced from the plane of image point 2, resulting in severe off-axis distortions. FIG. 5 shows that when the plane 18 is located in the diffraction plane of the lens, as in certain prior systems, the off-axis distortions are smaller than in the case of FIG. 4, but nevertheless still quite large. If, however, the plane 18 is moved closer to the lens, then the defocusing becomes far less severe, as shown in FIG. 6, in which it is actually located "inside" the lens. It is therefore advantageous to locate the plane as close to the specimen surface as possible, thereby allowing a greater field of view to be obtained for a given degree of off-axis defocusing.

In prior systems where an objective aperture is provided at plane 18 it is impossible to move it inside or even close to the lens without either distorting the field and interfering with the operation of an electrostatic lens or reducing access to the sample in the case of a magnetic lens. No such limitation exists in the case of the present invention. A further advantage of the invention is that the electron optical system is to some extent self-optimising as the magnification is changed. For example, if the overall magnification is reduced to allow a greater field of view, the plane 18 moves closer to the specimen so that the off-axis distortions for this greater field of view are decreased.

It will be appreciated that although the principles discussed above have been presented for the case of an electrostatic objective lens they are equally applicable to the case of a magnetic objective lens, or to a combined electrostatic/magnetic lens.

Figure 3:
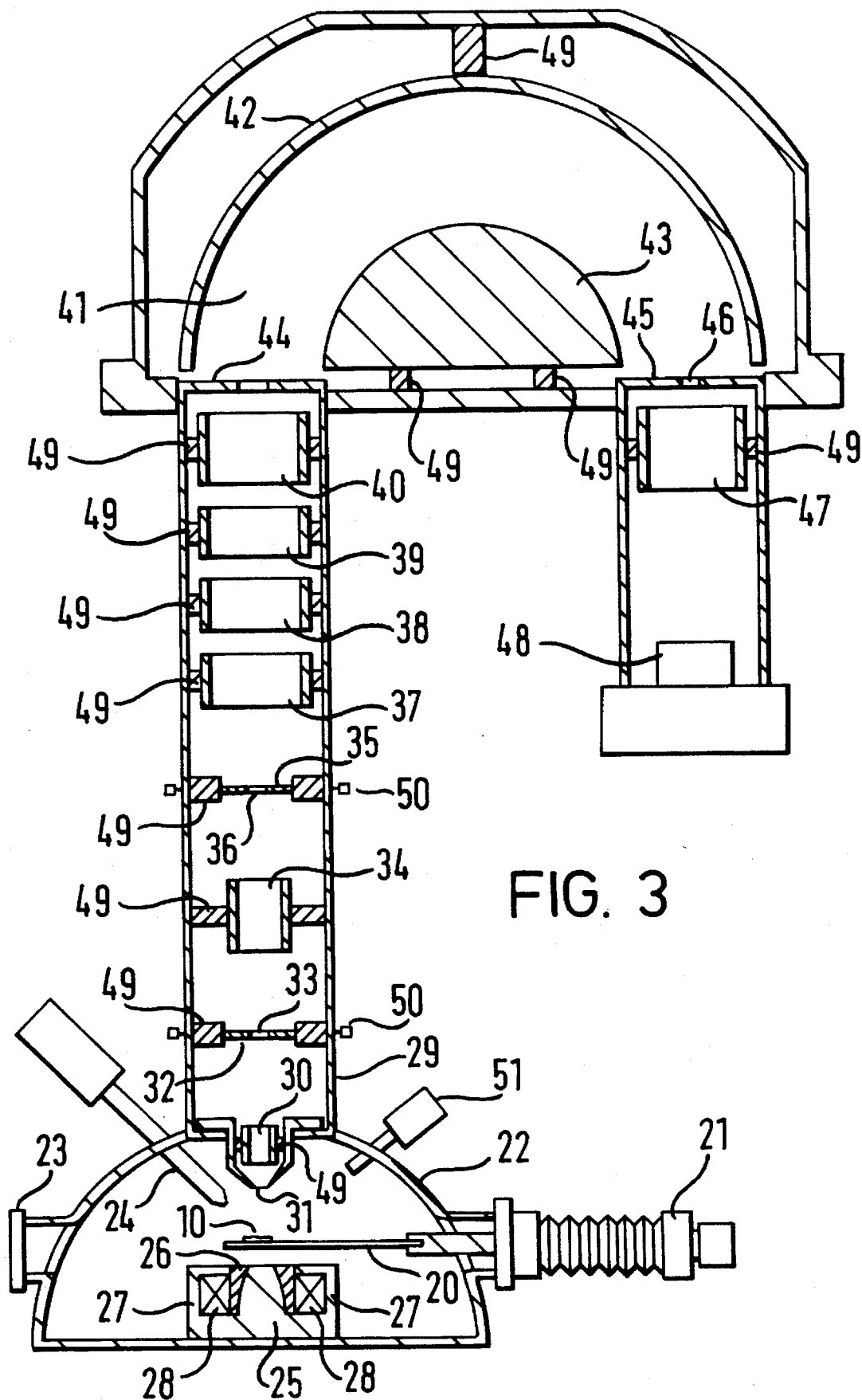
FIG. 3 shows a schematic cross-section of an embodiment of the invention.

Referring next to FIG. 3, a specimen 10 is supported by a specimen holder 20 which may be moved to the required position by a manipulator 21 which ideally allows motion in three dimensions.

The specimen 10 is sealed within a vacuum chamber 22 which is preferably maintained at ultra high vacuum via a manifold 23 through which a suitable pump (not shown) may act. In order to ensure the surface cleanliness of the specimen it is desirable to achieve a pressure of less than $10^{-8}$ mb and preferably less than $10^{-10}$ mb.

The specimen 10 is irradiated by means of a radiation source 24 that is located adjacent the specimen 10. A suitable source of radiation is the intense $K\alpha$ characteristic X-ray emissions of light elements such as aluminium and magnesium. Electrons are emitted from the entire specimen surface having trajectories distributed over a $2\pi$ steradian solid angle. A magnetic objective lens 25, comprising a central pole piece 26 and a connected annular pole piece 27, is provided. Between the pole pieces 26 and 27 there is disposed a coil 28 which when electrically energised gives rise to a magnetic field perpendicular to the specimen surface. Electrons emitted form the specimen surface pass into a lens column 29 through its entrance 31. An electrostatic objective lens 30 is also provided, permitting three different ways in which the function of the objective lens schematically represented by 11 in FIG. 2 can be realised. Firstly, the magnetic lens 25 may be used alone. Secondly the electrostatic lens 30 may be used alone, so that lens 30 then becomes equivalent to the lens 11 in FIG. 2. Thirdly, both the lenses 25 and 30 may be used simultaneously to provide in combination a compound objective lens equivalent to lens 11 of FIG. 2. However, the provision of lens 30 is not an essential feature of the invention.

The objective electron lens 25 and/or 30 forms an image of the surface at a first diaphragm 32 located at the image plane of the lens, (referenced at 15 in FIG. 2). An aperture 33 in the diaphragm 32 allows passage of electrons from only a certain area of the specimen determined by the size of the aperture 33 and the magnification of the objective lens. Electrons passing through aperture 33 are further focused by a second electron lens 34 which is equivalent to the second lens 12 in FIG. 2. A second diaphragm 35 containing an aperture 36 is located between the lens 34 and the entrance of an electron energy analyzer 41 to restrict the angular distribution of the transmitted electrons. This aperture is equivalent to the aperture 19 in FIG. 2. In one embodiment it may be located at the diffraction plane of lens 34, but as explained it is preferable for it to located farther from the lens, preferably between one and two focal lengths (of lens 34) from the centre of lens 34. This allows the advantages previously described to be obtained. The diaphragms 32 and 35 are provided with independently variable apertures 33 and 36 respectively to determine the properties of the electron image supplied to the energy analyzer 41. Such variation is provided by actuating means 50 which act to open and close the apertures 33 and 36. The preferred form of the diaphragms 32 and 35 is that of a mechanical iris similar to those used as aperture stops in optical instruments. A suitable mechanical iris will preferably provide an aperture which is continuously variable and preferably has a minimum diameter of the order 0.1 mm to 1 mm.

Following the diaphragm 35 is an electrostatic lens array, i.e., a third lens located in the lens column 29 in the disclosed embodiment, composed of lens elements 37,38, 39,40. This lens array functions as in the prior type of spectrometer disclosed in EP 246841 to receive the electrons comprised in the image formed by the lens 34 (in plane 17, FIG. 2), and to produce in the object plane of an energy analyzer 41 a Fourier transform of the image formed by lens 34. The analyzer 41 comprises hemispherical electrodes 42 and 43. A Herzog plate is located at the analyzer entrance to correct for fringing electric fields produced by the gap between electrodes 42 and 43. An electric field exists between the electrodes 42 and 43 that separates the electron beam into a spectrum of energies. An energy dispersed Fourier transformed image is formed at the exit focal plane of the energy analyzer 41, and a detection means 45 such as a channel electron multiplier plate or array is located here to record an energy spectrum of the sample. An aperture 46 allows the passage of electrons of a selected energy range E to E+ΔE. The electrons that pass through aperture 46 may be focused and back-transformed by another electron lens 47 to form on an imaging detector 48 a real image of the specimen surface comprising only those electrons having energies transmitted by the analyzer, as explained in EP 246841. The image on the detector 48 may be recorded electronically or viewed directly using, for example, a phosphor screen.

An electron source 51 is provided as an alternative radiation source to the X-ray source 24. The electrons provided by this source would typically have an energy in the range of several hundred electron Volts (eV). The electron source 51 causes the release of secondary electrons and elastically scattered primary electrons from the specimen surface which may be imaged by setting the energy analyzer 41 to the energy of the incident electron beam so that an electron image of the specimen is formed. This electron image of the sample may be used to align the specimen relative to the objective lens prior to use of the X-ray source 24.

The lens elements 30,34,37–40,47 and energy analyzer electrodes 42,43 are mounted on insulating supports 49 to allow for electrically biasing of these components. Similarly, any components which may be advantageously biased, such as the apertured diaphragms 32 and 35, may also be mounted on insulating supports. Bias voltages are supplied to components by electrical feedthroughs from a voltage source means (not shown) located outside the vacuum housing 22.

The size of the field of view of the embodiment of FIG. 3 is dependent on both the diameter of the area-defining aperture 33 and the excitation of the objective lenses 25,30. Typical values for the lens excitation and field of view diameter of the device may be seen in the table below. The imaging capabilities of the invention are given for the minimum and maximum iris apertures noted previously. Lens excitations are given in terms of the applied voltage in the case of electrostatic lenses and the number of Ampere turns in the case of the magnetic lens. The lens excitation is given in each instance as a function of the electron kinetic energy.

| Objective Lens | Objective Excitation | Second Lens Excitation | Field of View | |
|---|---|---|---|---|
| | | | Open Iris | Closed Iris |
| Electrostatic objective only | $15 \times KE$ | $2.2 \times KE$ | >9 mm | <200 μm |
| | $5 \times KE$ | $-0.8 \times KE$ | <1 mm | <50 μm |
| Magnetic objective only | $42(KE)^{0.5}$ | $2 \times KE$ | >1 mm | <50 μm |
| | $38(KE)^{0.5}$ | $-0.8 \times KE$ | <200 μm | <10 μm |

As may be seen from the above data, the invention enables the study of selected areas over a wide range. The optional provision of an electrostatic objective lens further increases the usefulness of this device.

I claim:

1. Apparatus for investigating a selected area of the surface region of a specimen comprising:

a specimen holder;

means for causing the emission of charged particles from a specimen placed on said specimen holder, said emission causing means including at least one source of radiation;

an objective lens for imaging at least some of said charged particles emitted from said specimen in an image plane;

a first diaphragm located proximate said image plane, said first diaphragm having an aperture therein which defines a selected area of the specimen to be investigated;

a second lens located downstream of said first diaphragm, said second lens refocusing charged particles which pass through said aperture in said first diaphragm;

means for analyzing the energy of the charged particles emitted from said selected area of the specimen, said analyzing means having an object plane and being disposed to receive at least some of the charged particles refocused by said second lens; and a second diaphragm located between said second lens and said analyzing means object plane, said second diaphragm having an aperture therein to define the collection angle of the charged particles from the specimen.

2. Apparatus as claimed in claim 1 wherein said objective lens comprises a magnetic lens.

3. Apparatus as claimed in claim 1 wherein said objective lens comprises an electrostatic lens.

4. Apparatus as claimed in claim 1 wherein said objective lens comprises both magnetic and electrostatic lenses which can be used independently or in combination.

5. Apparatus as claimed in claim 1 wherein said second lens has a diffraction plane and said second diaphragm is located proximate said diffraction plane.

6. Apparatus as claimed in claim 1 wherein said second lens has a diffraction plane and an image plane, and said second diaphragm is located between said diffraction plane and said image plane.

7. Apparatus as claimed in 6 wherein said second diaphragm is located between said diffraction plane and a point not greater than the focal length of said second lens from said diffraction plane.

8. Apparatus as claimed in claim 1 wherein a third lens is provided between said second lens and said analyzing means to re-focus the image produced by said second lens at the entrance of said analyzing means.

9. Apparatus as claimed in claim 1 wherein a third lens is provided between said second lens and said analyzing means to produce at the entrance of said analyzing means a Fourier transform of the image produced by said second lens.

10. Apparatus as claimed in claim 1 wherein said at least one source of radiation comprises an X-ray source.

11. Apparatus as claimed in claim 1 wherein said at least one source of radiation comprises an electron source.

12. Apparatus as claimed in claim 1 further comprising means for adjusting the sizes of the apertures in said first and second diaphragms.

13. Apparatus as claimed in claim 1 wherein the overall magnification of said objective and second lenses may be varied to change the area of the specimen imaged by said objective lens.

14. A method of investigating a selected area of the surface of a specimen, said method comprising:

(a) irradiating said specimen to cause the emission of charged particles therefrom;

(b) using an objective lens, focusing at least some of the charged particles emitted from said specimen to form a charged-particle image of said specimen in an image plane;

(c) selecting a portion of said charged-particle image by passing said charged particles through an aperture in a first diaphragm disposed proximate said image plane;

(d) using a second lens, re-focusing the charged particles passing though the aperture in said first diaphragm;

(e) defining the collection angle of said charged particles emitted from said specimen by passing the charged particles leaving said second lens through an aperture in a second diaphragm; and (f) passing at least some of the charged particles passing through the aperture in said second diaphragm into a charged-particle energy analyzer; wherein the second diaphragm is located between the second lens and an object plane of the energy analyzer.

15. A method as claimed in claim 14 wherein said objective lens comprises a magnetic field.

16. A method as claimed in claim 14 wherein said objective lens comprises an electrostatic field.

17. A method as claimed in claim 14 wherein said second lens has a diffraction plane and said second diaphragm is located between said diffraction plane and a point not greater than the focal length of said second lens from said diffraction plane.

18. A method as claimed in claim 14 wherein the area of said specimen from which charged particles are emitted and pass into said energy analyzer is selected by changing the overall magnification of said objective and said second lenses.

* * * * *